US007268590B2

(12) United States Patent
Kao et al.

(10) Patent No.: US 7,268,590 B2
(45) Date of Patent: Sep. 11, 2007

(54) METHOD AND APPARATUS FOR IMPLEMENTING SUBTHRESHOLD LEAKAGE REDUCTION IN LSDL

(75) Inventors: Jerry C. Kao, Rochester, MN (US); Chung-Tao Li, Rochester, MN (US); Salvatore Nicholas Storino, Rochester, MN (US); Christophe Robert Tretz, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 77 days.

(21) Appl. No.: 11/304,142

(22) Filed: Dec. 15, 2005

(65) Prior Publication Data

US 2007/0139082 A1   Jun. 21, 2007

(51) Int. Cl.
*H03K 19/096* (2006.01)

(52) U.S. Cl. ............................... 326/95; 326/97; 326/98

(58) Field of Classification Search ............. 326/95–98
See application file for complete search history.

(56) References Cited

U.S. PATENT DOCUMENTS 6,429,689 B1 *   8/2002   Allen et al. .................... 326/95
6,900,666 B2 *   5/2005   Kursun et al. ................ 326/95

* cited by examiner

*Primary Examiner*—Anh Q. Tran
(74) *Attorney, Agent, or Firm*—Joan Pennington

(57) ABSTRACT

A method and apparatus are provided for implementing subthreshold leakage current reduction in limited switch dynamic logic (LSDL). A limited switch dynamic logic circuit includes a cross-coupled NAND and inverter logic. A dynamic node provides a first input to the NAND. A sleep signal provides a second input to the NAND. An output of the NAND provides an input to the inverter logic that inverts the NAND output and provides a complementary output. The NAND logic includes a series connected first sleep transistor receiving the sleep input. The first sleep transistor is turned OFF during the sleep mode. A second sleep transistor is connected between a voltage supply rail and the NAND output. The second sleep transistor is turned ON during the sleep mode to force high the NAND output and force low complementary output.

15 Claims, 1 Drawing Sheet

METHOD AND APPARATUS FOR IMPLEMENTING SUBTHRESHOLD LEAKAGE REDUCTION IN LSDL

FIELD OF THE INVENTION

The present invention relates generally to the data processing field, and more particularly, relates to a method and apparatus for implementing subthreshold leakage current reduction in limited switch dynamic logic (LSDL).

DESCRIPTION OF THE RELATED ART

As silicon technologies move toward smaller transistor sizes with thinner oxides associated with smaller features sizes, leakage current typically increases. Leakage current grows relative to the overall power dissipation with smaller features sizes, for example, 40% for 90 nm and 50% to 60% for 65 nm.

Power dissipation is a signification limitation for high performance circuits such as dynamic logic and limited switch dynamic logic (LSDL). LSDL is a next-generation high-performance circuit family including a dynamic front-end and a static back-end. LSDL relies on the dynamic front-end to provide speedy computation. LSDL circuits suffer from the same leakage problems as other dynamic logic. In conventional LSDL circuits, leakage current exists between a voltage supply rail Vdd, a dynamic node, and ground.

A need exists for an effective mechanism to minimize subthreshold leakage current in LSDL circuits, and thereby reduce the overall power dissipation.

SUMMARY OF THE INVENTION

Principal aspects of the present invention are to provide are provided for a method and apparatus for implementing subthreshold leakage current reduction in limited switch dynamic logic (LSDL). Other important aspects of the present invention are to provide such method and apparatus for implementing subthreshold leakage current reduction in limited switch dynamic logic (LSDL) substantially without negative effect and that overcome many of the disadvantages of prior art arrangements.

In brief, a method and apparatus are provided for implementing subthreshold leakage current reduction in limited switch dynamic logic (LSDL). A limited switch dynamic logic circuit includes a cross-coupled NAND and inverter logic. A dynamic node provides a first input to the NAND. A sleep signal provides a second input to the NAND. An output of the NAND provides an input to the inverter logic that inverts the NAND output and provides a complementary output. The NAND logic includes a series connected first sleep transistor receiving the sleep input. The first sleep transistor is turned OFF during the sleep mode. A second sleep transistor is connected between a voltage supply rail and the NAND output. The second sleep transistor is turned ON during the sleep mode to force high the NAND output and force low complementary output.

In accordance with features of the invention, the NAND includes a series connected P-channel field effect transistor (PFET) and an N-channel field effect transistor (NFET) connected between a voltage supply rail and the sleep NFET and the first sleep transistor is an NFET. A pair of parallel-connected NFETs is connected between the sleep NFET and ground. One of the parallel-connected NFETs is a clocked NFET having a gate coupled to the clock. The other parallel-connected NFET has a gate coupled to the complementary output. A feedback PFET is coupled between the NAND output and the voltage supply rail by a clocked PFET. The feedback PFET has a gate coupled to the complementary output and is turned OFF by the clocked PFET during evaluation.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
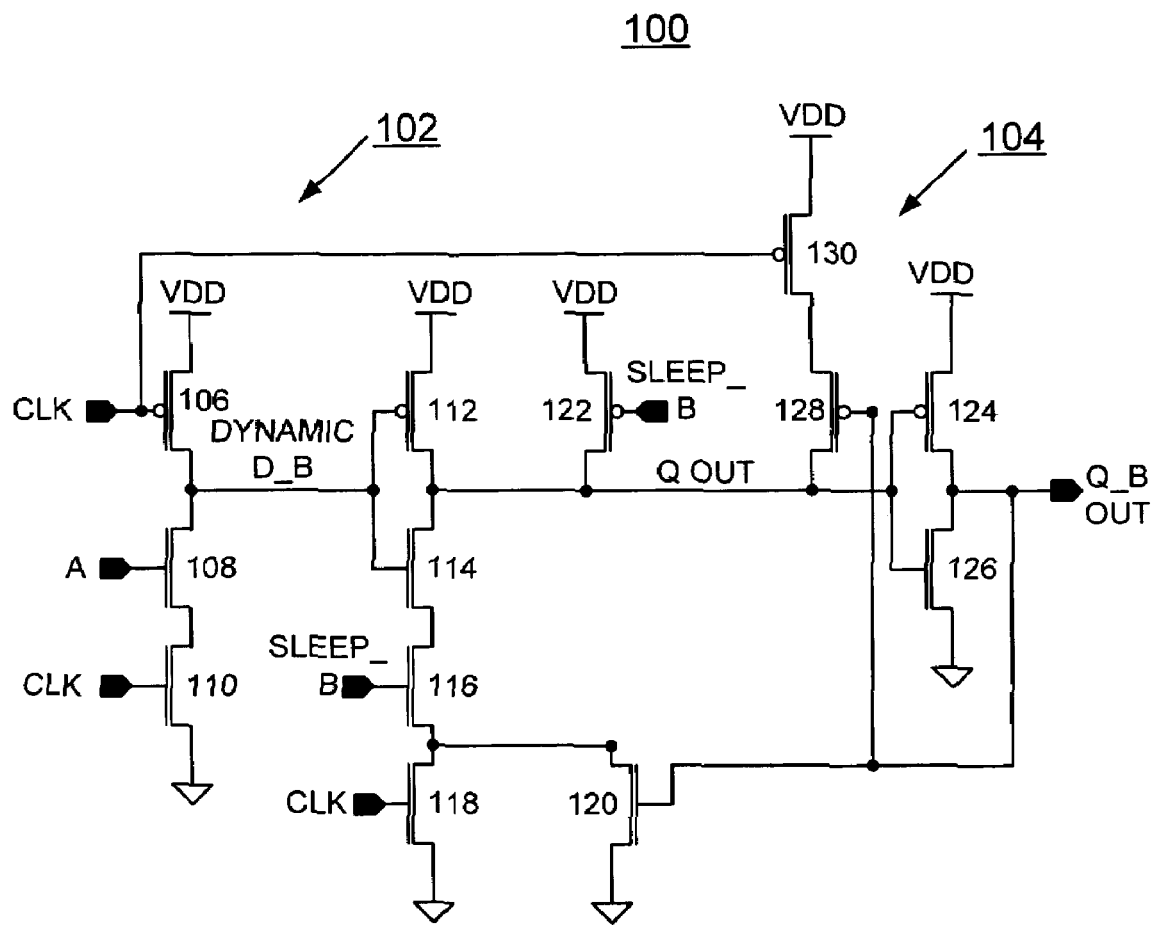
FIG. 1 is a schematic diagram illustrating an enhanced limited switch dynamic logic (LSDL) for implementing reduced subthreshold leakage current in accordance with the preferred embodiment.

In accordance with features of the invention, a method for implementing and an enhanced limited switch dynamic logic (LSDL) circuit are provided for substantially reducing subthreshold leakage current. The subthreshold leakage current is reduced between a dynamic node and ground through a stacking effect. The subthreshold leakage is reduced, for example, quadratically with minimum modification including the addition of one NMOS and PMOS transistor to a standard existing LSDL structure.

Having reference now to the drawings, in FIG. 1, there is shown an enhanced limited switch dynamic logic (LSDL) circuit for implementing reduced subthreshold leakage current generally designated by the reference character 100 in accordance with the preferred embodiment.

LSDL circuit 100 includes a dynamic front-end generally designated by 102 and a static back-end generally designated by 104. Dynamic front-end 102 includes a transistor stack including a P-channel field effect transistor (PFET) 106, and a pair of N-channel field effect transistor (NFETs) 108, 110 connected in series between a voltage supply rail VDD and ground. A clock signal CLK is applied to a gate input of PFET 106 and NFET 110. A data input A is applied to a gate input of NFET 108. The junction connection of the drain of PFET 106 and the drain of NFET 108 forms a dynamic node DYNAMIC D_B. PFET 106 precharges the dynamic node DYNAMIC D_B during logic zero of the clock signal CLK.

During precharge or a logic zero of the clock signal CLK, NFET 110 is OFF, and the pulldown path of NFETs 108, 110 is OFF with either a high or low data input A applied to NFET 108. NFET 110 turns ON and PFET 106 turns OFF during logic one of the clock signal CLK during an evaluate phase. In the evaluate phase, with a high data input A NFET 108 is ON and the dynamic node DYNAMIC D_B is pulled down. Otherwise, with a low data input A applied, NFET 108 remains OFF and the dynamic node DYNAMIC D_B remains high or logic one.

It should be understood that LSDL circuit 100 is shown in simplified form sufficient for the understanding of the invention, and the present invention is not limited to the illustrated embodiment. For example, a plurality of parallel connected or series connected transistors could be used instead of NFET 108, each for receiving one of multiple data inputs applied to the dynamic front-end 102.

In accordance with features of the invention, dynamic front-end 102 of LSDL circuit 100 feeds into a cross-coupled NAND and inverter logic of the static back-end 104. In a conventional LSDL circuit, the dynamic logic feeds into a pair of cross-coupled inverters. A series connected PFET 112, an NFET 114, and a sleep NFET 116 form NAND of the static back-end 104 of LSDL circuit 100. PFET 112, NFET 114, and a sleep NFET 116 are connected in series with a pair of parallel-connected NFETs 118 and 120 to ground. The dynamic node DYNAMIC D_B is coupled to the junction connection of gate inputs of PFET 112 and NFET 114. The clock signal CLK is applied to a gate input of NFET 118. An output feedback signal from an output node Q_B OUT is applied to a gate input of NFET 120. A junction connection of the drain of PFET 112 and the drain of NFET 114 provides a NAND output at a node Q OUT.

A sleep PFET 122 is coupled between the voltage supply rail VDD and a NAND output node Q OUT. A sleep input SLEEP_B is applied to the gate input of sleep NFET 116 and sleep PFET 122. An inverter formed by a PFET 124 and an NFET 126 connected between the voltage rail VDD and ground has a common gate input connected to the NAND output node Q OUT. Inverter pair PFET 124 and NFET 126 provides an inverted or complementary output at a node Q_B OUT. A PFET 128 and PFET 130 are connected between the NAND output node Q OUT and the voltage rail VDD. The clock signal CLK is applied to a gate input of PFET 130. The complementary output Q_B OUT is applied to a gate input of NFET 120 and PFET 128.

During the normal operation mode, the CLK toggles and SLEEP_B=1. During the normal operation mode, sleep NFET 116 is always ON with the high sleep input SLEEP_B applied to the gate of the sleep NFET. During the normal operation mode, the sleep PFET 122 is always OFF with the high SLEEP_B input. During the normal operation mode with the logic zero of the clock signal CLK, NFET 118 is OFF, and the pulldown path of NFETs 116 and 118 is OFF.

During the normal operation mode with the logic zero of the clock signal CLK, the NAND output Q OUT is held high by PFETs 128, 130 and inverter pair PFET 124, NFET 126. NFET 118 turns ON and clocked PFET 130 turns OFF during logic one of the clock signal CLK during evaluation.

During evaluation of the normal operation mode, PFET 130 is OFF and gates off the pull up feedback path through PFET 128. The NAND output Q OUT is pulled down with a high dynamic node DYNAMIC D_B resulting from a low input A applied to the dynamic front end 102. The NAND output Q OUT remains high with a low dynamic node DYNAMIC D_B resulting from a high input A. The output Q_B OUT follows the dynamic node DYNAMIC D_B.

During the sleep mode, CLK is gated to 0 and SLEEP_B is set to low or logic zero. When SLEEP_B=0, the node Q OUT is forced high or logic one with sleep PFET 122 turned ON, and the output node Q_B OUT is forced to low or logic zero with inverter pair PFET 124, NFET 126.

As a result the subthreshold leakages at node Q OUT and the dynamic node of the downstream LSDL logic are reduced. The subthreshold leakage at Q OUT is reduced because sleep NFET 116 and NFETs 118 and 120 are all shut off. Also the subthreshold leakage at the dynamic node of the downstream LSDL logic is reduced because the inputs of its NMOS pulldown come from upstream LSDL logic circuits 100 having outputs Q_B OUT that are forced to logic zero.

In addition, the sleep PMOS PFET 122 advantageously is sized with the minimum width. This does not impact performance since PFET 122 is used only during the sleep mode. This further reduces the performance impact of the additional sleep transistors NFET 116 and PFET 122 to the conventional existing LSDL design.

While the present invention has been described with reference to the details of the embodiments of the invention shown in the drawing, these details are not intended to limit the scope of the invention as claimed in the appended claims.

What is claimed is:

1. Apparatus for implementing subthreshold leakage current reduction in limited switch dynamic logic (LSDL) circuit comprising:
   a static portion including a cross-coupled NAND logic and inverter logic;
   a dynamic node provides a first input to said NAND logic;
   a sleep signal provides a second input to said NAND logic;
   an output of the NAND logic providing an input to said inverter logic, said inverter logic inverting the NAND output and provides a complementary output;
   said NAND logic including a series connected first sleep transistor receiving said sleep signal; said first sleep transistor being turned OFF during the sleep mode to disable said NAND logic; and
   a second sleep transistor connected between a voltage supply rail and said NAND output; said second sleep transistor receiving said sleep signal and being turned ON during the sleep mode for forcing said NAND output high and said complementary output low.

2. Apparatus for implementing subthreshold leakage current reduction as recited in claim 1 wherein said NAND logic includes a series connected P-channel field effect transistor (PFET) and an N-channel field effect transistor (NFET) connected between a voltage supply rail and said sleep NFET.

3. Apparatus for implementing subthreshold leakage current reduction as recited in claim 2 wherein said first sleep transistor is an NFET.

4. Apparatus for implementing subthreshold leakage current reduction as recited in claim 2 wherein said NAND logic includes a pair of parallel-connected NFETs connected between said sleep transistor and ground.

5. Apparatus for implementing subthreshold leakage current reduction as recited in claim 4 wherein a first one of said parallel-connected NFETs is a clocked NFET having a gate coupled to a clock signal.

6. Apparatus for implementing subthreshold leakage current reduction as recited in claim 5 wherein a second one of said parallel-connected NFETs has a gate coupled to said complementary output, and said parallel-connected first and second NFETs being turned OFF during the sleep mode.

7. Apparatus for implementing subthreshold leakage current reduction as recited in claim 1 wherein said static portion includes a series connected feedback PFET and a clocked PFET having a gate coupled to a clock signal, said series connected feedback PFET and clocked PFET coupled between said NAND output and the voltage supply rail.

8. Apparatus for implementing subthreshold leakage current reduction as recited in claim 7 wherein said feedback PFET has a gate coupled to said complementary output and said feedback PFET is turned OFF by the clocked PFET during logic one of the clock signal during evaluation.

9. Apparatus for implementing subthreshold leakage current reduction as recited in claim 1 includes a dynamic front-end portion including a transistor stack connected in series between a voltage supply rail VDD and ground.

10. Apparatus for implementing subthreshold leakage current reduction as recited in claim 9 wherein said transistor stack includes a precharge P-channel field effect transistor (PFET) for precharging said dynamic node during logic zero of a clock signal, said precharge PFET connected in series with a pair of N-channel field effect transistor (NFETs), and a junction connection of a drain of said precharge PFET and a drain of series connected one of said NFETs forming said dynamic node.

11. Apparatus for implementing subthreshold leakage current reduction as recited in claim 9 wherein a data input is applied to a gate of a first NFET of said series connected NFETs and a clock signal is applied to a gate input of said precharge PFET and a second NFET of said series connected NFETs.

12. Apparatus for implementing subthreshold leakage current reduction as recited in claim 1 wherein said second sleep transistor includes a minimum width size.

13. A method for implementing subthreshold leakage current reduction in limited switch dynamic logic (LSDL) circuit comprising:
 providing a cross-coupled NAND logic and inverter logic to define a static portion of the LSDL circuit; providing an input to said inverter logic of an output of the NAND logic, inverting the NAND output with said inverter logic to provide a complementary output;
 applying a first dynamic node input to said NAND logic;
 applying a sleep signal input to said NAND logic;
 providing said NAND logic with a series connected first sleep transistor receiving said sleep signal; and said first sleep transistor being turned OFF during the sleep mode to disable said NAND logic; and
 providing a second sleep transistor connected between a voltage supply rail and said NAND output; said second sleep transistor receiving said sleep signal and being turned ON during the sleep mode for forcing said NAND output high and said complementary output low.

14. A method for implementing subthreshold leakage current reduction as recited in claim 13 further includes providing said static portion with a series connected feedback PFET and a clocked PFET having a gate coupled to a clock signal, said series connected feedback PFET and clocked PFET coupled between said NAND output and a voltage supply rail.

15. A method for implementing subthreshold leakage current reduction as recited in claim 14 wherein said feedback PFET has a gate coupled to said complementary output and said feedback PFET is turned OFF by the clocked PFET during logic one of the clock signal during evaluation.

* * * * *

UNITED STATES PATENT AND TRADEMARK OFFICE
CERTIFICATE OF CORRECTION

| | | |
|---|---|---|
| PATENT NO. | : 7,268,590 B2 | Page 1 of 1 |
| APPLICATION NO. | : 11/304142 | |
| DATED | : September 11, 2007 | |
| INVENTOR(S) | : Jerry C. Kao et al. | |

It is certified that error appears in the above-identified patent and that said Letters Patent is hereby corrected as shown below:

On page 1, the name of the second inventor is incorrectly shown as Chung-Tao Li, Please correct the second inventor name as follows:

Chun-Tao Li

Signed and Sealed this

Eleventh Day of December, 2007

JON W. DUDAS
*Director of the United States Patent and Trademark Office*